(12) United States Patent
Koyama

(10) Patent No.: US 8,514,642 B2
(45) Date of Patent: Aug. 20, 2013

(54) SEMICONDUCTOR MEMORY DEVICE

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 292 days.

(21) Appl. No.: 13/005,561

(22) Filed: Jan. 13, 2011

(65) Prior Publication Data

US 2011/0176377 A1 Jul. 21, 2011

(30) Foreign Application Priority Data

Jan. 20, 2010 (JP) ................................. 2010-010522

(51) Int. Cl.
*G11C 7/00* (2006.01)

(52) U.S. Cl.
USPC ......................... 365/200; 365/159; 365/225.7

(58) Field of Classification Search
USPC ....................................... 365/200, 149, 225.7
See application file for complete search history.

(56) References Cited

U.S. PATENT DOCUMENTS

| | | | |
|---|---|---|---|
| 5,381,370 A * | 1/1995 | Lacey et al. .................. | 365/200 |
| 5,402,377 A | 3/1995 | Ohhata et al. | |
| 5,644,539 A | 7/1997 | Yamagami et al. | |
| 6,041,000 A | 3/2000 | McClure et al. | |
| 6,127,702 A | 10/2000 | Yamazaki et al. | |
| 6,130,837 A | 10/2000 | Yamagami et al. | |
| 6,178,124 B1 | 1/2001 | Kaiser et al. | |
| 6,243,306 B1 * | 6/2001 | Kirihata ........................ | 365/200 |
| 6,341,085 B1 | 1/2002 | Yamagami et al. | |
| 6,347,051 B2 | 2/2002 | Yamagami et al. | |
| 6,434,033 B1 | 8/2002 | Chien | |
| 6,563,749 B2 | 5/2003 | Ferrant | |
| 6,567,334 B2 | 5/2003 | Yamagami et al. | |
| 6,633,504 B1 | 10/2003 | Lee et al. | |
| 6,788,609 B2 | 9/2004 | Yamagami et al. | |
| 6,842,386 B2 * | 1/2005 | Suzuki .......................... | 365/200 |
| 6,925,012 B2 | 8/2005 | Yamagami et al. | |
| 6,967,878 B2 | 11/2005 | Dono | |

(Continued)

FOREIGN PATENT DOCUMENTS

| | | |
|---|---|---|
| EP | 0548564 A | 6/1993 |
| EP | 0844617 A | 5/1998 |
| JP | 11-232895 A | 8/1999 |

OTHER PUBLICATIONS

International Search Report (Application No. PCT/JP2010/073662) Dated Apr. 5, 2011.

(Continued)

*Primary Examiner* — Son Dinh
(74) *Attorney, Agent, or Firm* — Eric J. Robinson; Robinson Intellectual Property Law Office, P.C.

(57) ABSTRACT

A driver circuit having a redundant control function to store address data of a defective memory cell is provided to compensate a defect of a memory cell array. In other words, address data of a defective memory cell is stored not by using part of the memory cell array, but by using a non-volatile memory, which is provided in a memory controller, to store address data of a defective memory cell. The memory controller storing the address data of a defective memory cell contributes an increase in process speed, because it is not necessary to access the memory cell array in order to obtain the address data of the defective memory cell.

18 Claims, 11 Drawing Sheets

(56) References Cited

U.S. PATENT DOCUMENTS

| | | |
|---|---|---|
| 7,002,851 B2 | 2/2006 | Yamagami et al. |
| 7,006,386 B2 | 2/2006 | Yamagami et al. |
| 7,064,995 B2 | 6/2006 | Yamagami et al. |
| 7,082,510 B2 | 7/2006 | Yamagami et al. |
| 7,123,519 B2 | 10/2006 | Yamagami et al. |
| 7,154,805 B2 | 12/2006 | Yamagami et al. |
| 7,184,320 B2 | 2/2007 | Yamagami et al. |
| 7,239,564 B2 | 7/2007 | Mutaguchi |
| 7,327,624 B2 | 2/2008 | Yamagami et al. |
| 7,358,590 B2 | 4/2008 | Yukawa et al. |
| 7,379,379 B2 | 5/2008 | Yamagami et al. |
| 7,447,072 B2 | 11/2008 | Yamagami et al. |
| 7,605,410 B2 | 10/2009 | Takano et al. |
| 7,674,650 B2 | 3/2010 | Akimoto et al. |
| 7,715,243 B2 | 5/2010 | Yamagami et al. |
| 7,719,872 B2 | 5/2010 | Kato |
| 2001/0005013 A1 | 6/2001 | Nagamatsu et al. |
| 2001/0030890 A1 | 10/2001 | Yamagami et al. |
| 2002/0085416 A1 | 7/2002 | Yamagami et al. |
| 2003/0210587 A1 | 11/2003 | Yamagami et al. |
| 2004/0208060 A1 | 10/2004 | Yamagami et al. |
| 2005/0162899 A1 | 7/2005 | Yamagami et al. |
| 2007/0108446 A1 | 5/2007 | Akimoto |
| 2008/0151660 A1 | 6/2008 | Inoue et al. |
| 2010/0148171 A1 | 6/2010 | Hayashi et al. |
| 2010/0191902 A1 | 7/2010 | Yamagami et al. |
| 2010/0195367 A1 | 8/2010 | Kato |

OTHER PUBLICATIONS

Written Opinion (Application No. PCT/JP2010/073662) Dated Apr. 5, 2011.

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply Dram's,", IEEE Transactions on Electron Devices, Jun. 1, 1994, vol. 41, No. 6, pp. 926-931.

\* cited by examiner

SEMICONDUCTOR MEMORY DEVICE

TECHNICAL FIELD

The present invention relates to a semiconductor memory device. An embodiment of the present invention relates to a semiconductor memory device having a redundant function.

BACKGROUND ART

As an example of a non-volatile memory, a flash memory is known. In the flash memory, charge needs to be injected to a floating gate with high voltage and a step-up circuit is needed for writing and erasing data. The flash memory has a problem of high power consumption due to generation of high voltage with a step-up circuit.

Not only in the flash memory but also in other semiconductor memories, a memory cell array includes a defective memory cell in which data cannot be stored. Because data cannot be accurately stored when a defective memory cell is included, the method in which a defective memory cell is cut by a laser in a manufacturing step is used as the countermeasure, for example. An advantage of laser cut is that a manufacturing process does not need to be changed. However, a special apparatus is required because an inspection step is needed for performing the laser cut, which causes a problem in that the operation is complicated.

As another way to compensate a defective memory cell, there is a method in which a redundant memory cell array is provided in addition to a main memory cell array (e.g., see Patent Document 1). According to the method, address data of a defective memory cell in the main memory cell array is stored in the redundant data storage memory cell array, and in accordance with the stored data, when the defective memory cell is selected, the redundant memory cell is read out instead of the defective memory cell.

However, the redundant data storage memory cell array in which address data of a defective memory cell is stored includes memory cells which are the same as those of the main memory cell array; therefore, the memory capacity which the memory device should have had is reduced.

Further, the redundant data storage memory cell array is manufactured through the same process and includes a memory cell with the same structure as the main memory cell array, which means that a defective memory cell is generated as often as in the main memory cell array. Therefore, the redundant data storage memory cell array also needs an inspection step for finding a defective memory cell.
[Reference]
[Patent Document]
[Patent Document 1] Japanese Published Patent Application No. H11-232895

DISCLOSURE OF INVENTION

It is an object of one mode of the present invention is to provide a semiconductor memory device in which a defective memory cell is not selected without storing address data of the defective memory cell in the memory capacity of a main memory cell array.

One mode of the present invention is a semiconductor memory device in which a memory driver circuit having a redundant control function for storing address data of a defective memory cell is provided to compensate a defect of a memory cell array. In other words, in the semiconductor memory device, the above-described problems are solved not by storing the address data of a defective memory cell in part of a memory cell array provided for storing data, but by providing in a memory controller a non-volatile memory for storing address data of a defective memory cell.

The memory controller storing the address data of a defective memory cell contributes an increase in process speed, because it is not necessary to access the memory cell array in order to obtain the address data of the defective memory cell.

In the semiconductor memory device, a driver circuit portion such as a decoder circuit includes a transistor with high operation speed. For example, an insulated-gate field-effect transistor including a silicon semiconductor is included in the driver circuit.

When a memory cell array in the semiconductor memory device includes a transistor having a floating gate, a non-volatile memory can be obtained. Further, when the memory cell array has a circuit structure of a dynamic random access memory (dynamic RAM), a static RAM, or a ferroelectric memory, a non-volatile memory can be obtained.

The memory cell array virtually has a memory region to store data and a redundant memory region for redundancy. In the case where a memory region includes a defective memory cell, a memory cell in the redundant memory region is used as an alternative to the defective memory cell. The redundant function of the semiconductor memory device is achieved by the memory controller. The memory controller has a memory storing the address of a defective memory cell. In the case where the defective memory cell is selected, the memory controller operates not to select the defective memory cell, but to select a memory cell in the redundant memory region.

The memory of the memory controller can be formed with the use of a floating gate transistor as described above, but the memory preferably has the following structure because a non-volatile memory can operate with the same driving voltage as the driver circuit (logic circuit).

A memory to store the address data of a defective memory cell can be formed with the use of two transistors and one capacitor. Specifically, the memory cell has a circuit structure in which a gate electrode of a first transistor and a drain electrode of a second transistor are electrically connected and the capacitor is electrically connected to the drain electrode and the gate electrode. In this case, by using a transistor with low off-state current for the second transistor, electric charge charged in the capacitor can be held for a long time, so that the memory can be substantially used as a non-volatile memory.

In order to use the memory to store the address data of a defective memory cell as a non-volatile memory, the off-state current of the second transistor per micrometer of channel width is 100 aA/μm or lower, preferably 1 aA/μm or lower, more preferably 100 zA/μm (1 zA (zeptoampere) is $1\times10^{-21}$ A) or lower, and still more preferably 10 zA/μm or lower. In this manner, the electric charge which the capacitor loses due to the leakage current of the second transistor is negligible. Although the capacitor is electrically connected to a gate electrode of the second transistor as described above, as long as the gate leakage current (the leakage current of a gate insulating film) is almost negligible, the electric charge holding characteristics of the capacitor are not affected because the second transistor is an insulating-gate type MOS transistor.

A memory to store the address data of a defective memory cell is provided separately from the main memory cell array, each of which can be formed with a different memory element and a different memory circuit.

A memory cell array provided in a memory controller does not include a floating gate transistor, so that high voltage is not necessary to write data to a memory; thus, data can be written with a normal operation voltage and data can be stored without refresh operation needed for a dynamic RAM.

A semiconductor memory device of one mode of the present invention includes a memory cell array in which memory cells are arranged in matrix with word lines and bit lines and which has a main memory region and a redundant memory region; a driver circuit controlling a signal of the word line and the bit line; and a memory controller controlling the operation of the driver circuit. The memory controller includes a memory portion storing address data of a defective memory cell in the main memory region, and a redundant address storage portion storing address data of the redundant memory region so that a row in the redundant memory region is read out instead of a row having the defective memory cell.

The memory portion of the memory controller can include a memory cell in which a gate electrode of a first transistor and a drain electrode of a second transistor are electrically connected and a capacitor is electrically connected to the drain electrode and the gate electrode. In addition, the memory cell in which the gate electrode of the first transistor and the drain electrode of the second transistor are electrically connected and the capacitor is electrically connected to the drain electrode and the gate electrode can be used as a main memory of the semiconductor memory device.

A preferable mode of the second transistor includes a channel formation region formed in an oxide semiconductor layer. As a result, the off-state current per micrometer of the channel width of the second transistor can be 100 aA/μm or lower, preferably 1 aA/μm or lower, more preferably 100 zA/μm or lower, and further preferably 10 zA/μm or lower.

In this specification, the ordinal number such as "first", "second", or "third" is given for convenience to distinguish elements, and not given to limit the number, the arrangement, and the order of the steps unless otherwise specified.

In this specification, when a component is "over" or "under" another component, the former component may be directly formed on the latter component, or still another component may be provided therebetween.

In this specification, terms in a singular form which are used for description of the embodiments include a concept of plural, unless it is contextually clear that a singular form or a plural form is intentionally used. The word "include" or "have" is used to express the presence of a characteristic, a number, a step, operation, a component, a piece, or combination thereof, and do not eliminate the possibility of presence or addition of one or more other characteristics, numbers, steps, operation, components, pieces, or combination thereof.

In this specification, all the terms which are used including the technical or scientific terms have the same meaning as ones which can be generally understood by those who have conventional knowledge in the technical field to which the present invention belongs. The terms same as ones defined in a commonly-used dictionary should be interpreted as including the meaning in accordance with the meaning in the context of the related art, and should not be interpreted as being ideally or excessively literally unless they are defined clearly in this specification.

A semiconductor memory device with higher operation speed can be provided by storing the address data of a defective memory cell in a memory controller, because unlike in a conventional semiconductor memory device having a redundant function, the address data of the defective memory cell can be obtained without access to a memory cell array. Further, a region to store address data of a defective memory cell is provided outside the memory cell array, so that the semiconductor memory device can be provided in which the defective memory cell is not selected without storing the address data of the defective memory cell in the memory capacity of the memory cell array.

BEST MODE FOR CARRYING OUT THE INVENTION

Figure 1:
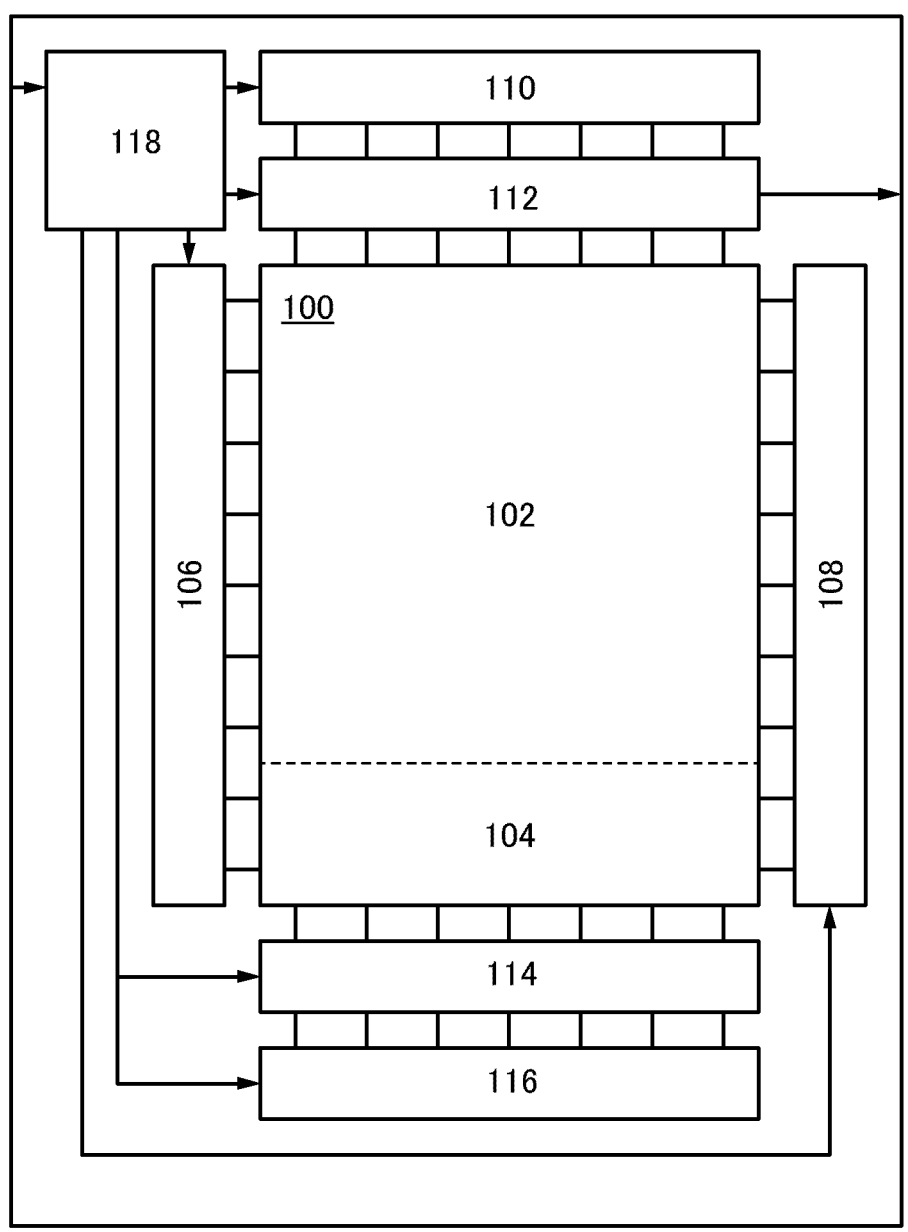
FIG. 1 is a block diagram illustrating a structure (NOR type) of a semiconductor memory device relating to one embodiment.

Hereinafter, the embodiment of the present invention will be described with reference to the accompanying drawings. Note that the invention disclosed in this specification is not limited to the following description and it will be readily appreciated by those skilled in the art that modes and details can be modified in various ways without departing from the spirit and the scope of the present invention. Therefore, this invention disclosed in this specification is not interpreted as being limited to the description of the embodiment below.

In the embodiment, in the case of using drawings for description, the note indicating the same component is sometimes used in common in different drawings. The thickness, width, relative relation of position, and the like of elements illustrated in the drawings are exaggerated for clarification of description of the embodiments in some cases.

Voltage generally refers to a difference between potentials at two points (also referred to as a potential difference). However, in some cases, values of both a voltage and a potential are represented using volt (V) in a circuit diagram or the like, so that it is difficult to discriminate between them. Thus, in this specification, a potential difference between a potential at one point and a reference potential is sometimes referred to as a voltage at the point unless otherwise specified.

<System Structure of Semiconductor Memory Device (NOR)>

FIG. 1 illustrates a structure of a memory circuit of a semiconductor memory device relating to one embodiment of the present invention. FIG. 1 illustrates the case where the semiconductor memory device is formed including a NOR-type non-volatile memory. Note that the structure similar to that in FIG. 1 can be applied to the case where the semiconductor memory device is formed including a NAND-type non-volatile memory.

The memory circuit in FIG. 1 includes a memory cell array 100, an X direction reading decoder 106, an X direction writing decoder 108, a Y direction reading decoder 110, a Y direction reading circuit 112, a Y direction writing decoder 116, a Y direction writing circuit 114, and a memory controller 118. The memory cell array 100 is divided into a main memory region 102 and a redundant memory region 104.

In the case of a NOR-type memory, data is written to and read from the memory cell array 100 for each row; accordingly, the main memory region 102 and the redundant memory region 104 are subjected to data writing and data reading in each TOW.

The following description is made on the assumption that the memory cell array 100 has 1024 bits in total arranged in matrix: 32 bits in the X direction and 32 bits in the Y direction. Needless to say, the number of bits of the memory cell array 100 is not limited thereto and any number of bits can be applied.

<Memory Controller>

Figure 2:
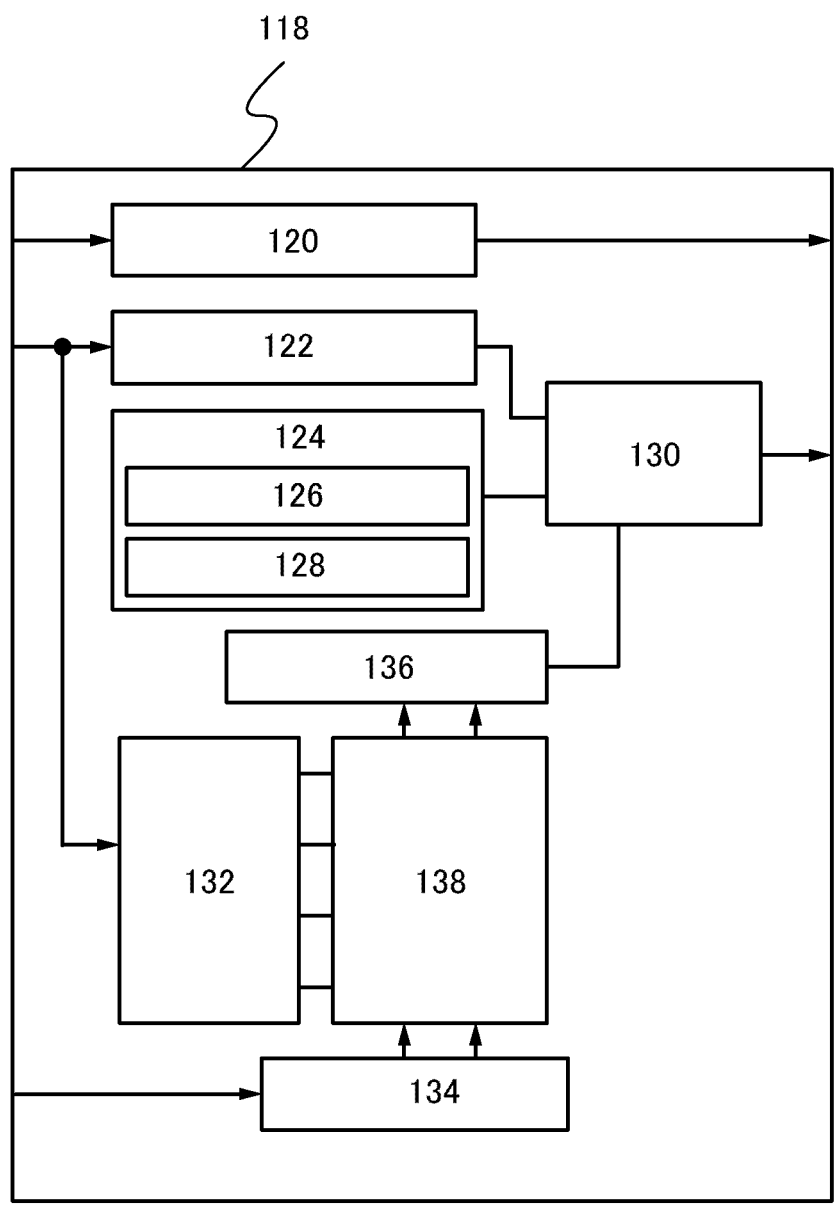
FIG. 2 is a block diagram illustrating a structure of a memory controller of a semiconductor memory device relating to one embodiment.

FIG. 2 illustrates a block diagram of the memory controller 118. The memory controller 118 includes a Y address latch 120, an X address latch 122, a redundant address storage portion 124, a selector 130, a reading circuit 136, an address decoder 132, a memory cell array 138, and a writing circuit 134. The redundant address storage portion 124 stores a redundant X address 126 and a redundant X address 128.

The memory cell array 138 integrated into the memory controller 118 includes a non-volatile memory which can hold stored data for a predetermined period. The address data of a defective memory cell included in the memory cell array 100 is stored in the memory cell array 138 including a non-volatile memory. Then, the memory controller 118 stores the address data of the memory cell of the redundant memory region 104 in the redundant address storage portion 124 to read out the memory cell of the redundant memory region 104 instead of the defective memory cell included in the main memory region 102.

The memory capacity of the memory cell array 138 can be determined as appropriate. For example, the memory cell array 138 has memory capacity corresponding to the number of rows of the main memory region 102. Specifically, the memory cell array 138 is formed to have the same number of rows as the main memory region 102.

The data which indicates presence of the defective memory cell is stored in a row of the memory cell array 138 corresponding to the row with the defective memory cell of the main memory region 102. When the row having the defective memory cell is specified, the memory controller 118 operates so as not to select the row but to select the address of the redundant memory region 104.

For example, when the redundant memory region 104 has two rows, the main memory region 102 can have at most two rows having defective memory cells. Needless to say, the larger the number of rows of the redundant memory region 104 becomes, the larger the number of rows having defective memory cells in the main memory region 102 becomes. As for the data stored in the memory cell array 138 which corresponds to the main memory region 102, for example, data "00" is stored in a row having no defective memory cell and data "01" or "10" is stored in a row having a defective memory cell.

The memory controller 118 having such a structure operates in the following manner to compensate a defective memory cell of the memory cell array 100.

First, a product is inspected in a manufacturing factory before shipment. In this step, inspection is performed to find a defective memory cell in the main memory region 102 and the redundant memory region 104 of the memory cell array 100. The inspection is performed for each row of the memory cell array 100. Specifically, in the inspection, whether one or more defective memory cells are included in each row of the memory cell array 100 is judged.

In the inspection, when each row of the redundant memory region 104 has a defective memory cell, the product is treated as a defective product. When each row of the main memory region 102 is inspected and the number of rows having a defective memory cell is two or less, the operation of the memory controller 118 enables the memory to be usable.

Note that in the memory controller 118, the address of the first row of the redundant memory region 104 is stored in the redundant X address 126 and the address of the second row of the redundant memory region 104 is stored in the redundant X address 128, in advance. Because the stored data is not changed later, the data may be stored in a mask ROM or the like or a predetermined logic pattern may be used.

In accordance with the result of the inspection, the writing circuit 134 writes any of data "00", data "01", and data "10" to each row of the memory cell array 138.

For example, when defective memory cells are detected in the fifth row and the tenth row of the main memory region 102 through the inspection, "01" is stored in the fifth row of the memory cell array 138, "10" is stored in the tenth row of the memory cell array 138, and "00" is stored in the other rows.

<Operation of Semiconductor Memory Device>

Since the memory cell array 138 includes a non-volatile memory cell, stored data is held in the memory controller 118 even after the inspection step. In this case, the semiconductor memory device in actual use operates as follows.

The address of a memory to which data is written or from which data is read is input to the memory controller 118. The address (an X address, a Y address) is temporarily stored in the X address latch 122 and the Y address latch 120. Concurrently, the X address is input to the address decoder 132 and data corresponding to the specified address, specifically the X address input to the address decoder 132, is read from the reading circuit 136 through the memory cell array 138.

When the data read from the memory cell array 138 is "00", the selector 130 outputs the data of the X address latch 122 without any change. When the data read from the memory cell array 138 is "01", the selector 130 selects the address data of the redundant X address 126. When the data read from the memory cell array 138 is "10", the selector 130 selects the address data of the redundant X address 128.

In the example described above, the address of the first row of the redundant memory region 104 is output when the address of the fifth row is input, the address of the second row of the redundant memory region 104 when the address of the tenth row is input, and the address is output as it is when the addresses of the other rows are input.

In such a manner, data can be stored in the memory cell array 100 without using a defective memory cell of the main memory region 102. In the semiconductor memory device in this embodiment, the address data of a defective memory cell need not be stored in the memory cell array 100, which is advantageous in that the memory capacity which the memory cell array 100 originally has does not have to be reduced.

<System Structure of Semiconductor Memory Device (NAND)>

The above description is made on the case where the memory cell array 100 is included in a NOR-type non-volatile memory, and the same principal can be applied to the memory cell array 100 included in a NAND-type non-volatile memory.

Figure 3:
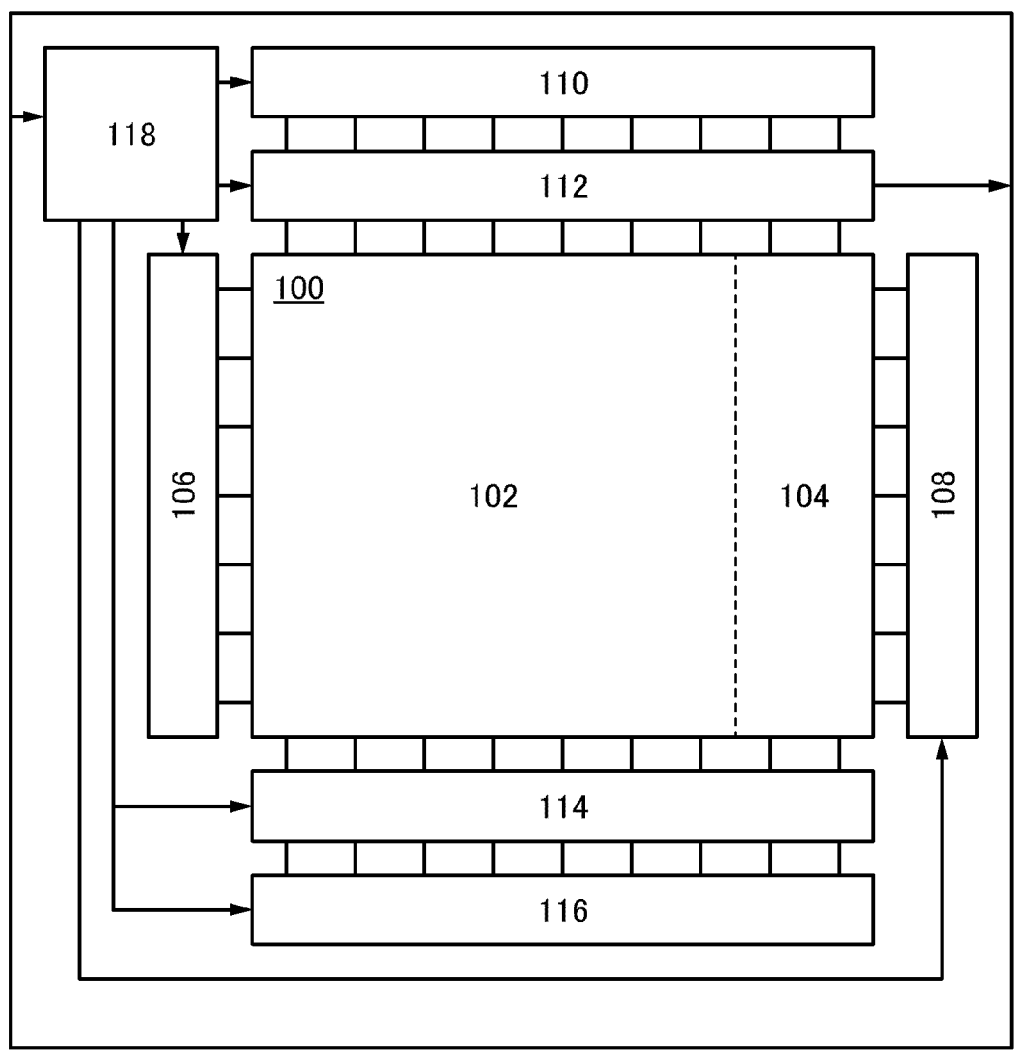
FIG. 3 is a block diagram illustrating a structure (NAND type) of a semiconductor memory device relating to one embodiment.

FIG. 3 illustrates a structure of a semiconductor memory device in which the memory cell array 100 is included in a NAND-type non-volatile memory. When the memory cell array 100 is included in a NAND-type non-volatile memory, the redundant memory region 104 is provided in the X direction because data is written and read in each column, and the other structure and the operation are similar to those of the above NOR-type semiconductor memory device.

<Other Structures of Memory Cell Array (1)>

The memory cell array 100 can form a dynamic RAM, a static RAM, or a ferroelectric memory as well as a non-volatile memory and any of them can similarly operate, so that the redundancy of a memory can be realized. In any case, the memory controller 118 illustrated with reference to FIG. 2 can be used as long as the memory cell array has a structure in which memory cells are arranged in matrix and a specified row address (or a column address) of a main memory region is replaced by a row address (or a column address) of a redundant memory region when a defective memory cell is in the specified row address (or a column address).

<Other Structures of Memory Cell Array (2)>

The memory cell array 100 can include a transistor using a semiconductor whose band gap is wider than that of a silicon semiconductor in addition to a transistor including a silicon semiconductor. The off-state current of the transistor can be lower with the use of a semiconductor having a wide band gap, so that a memory with a novel structure can be realized. Silicon carbide (SiC), gallium nitride (GaN), or the like is known as a semiconductor with a wider band gap than a silicon semiconductor, but a device including such semiconductors has cannot be manufactured with high productivity because process temperatures of them are higher than that of a silicon semiconductor.

In contrast, an oxide semiconductor (preferably a metal oxide semiconductor) has a band gap of 2.5 eV or more, preferably 3 eV or more, is easily formed by sputtering, a printing method, or the like, and is low in process temperature, which are advantageous.

Figure 4:
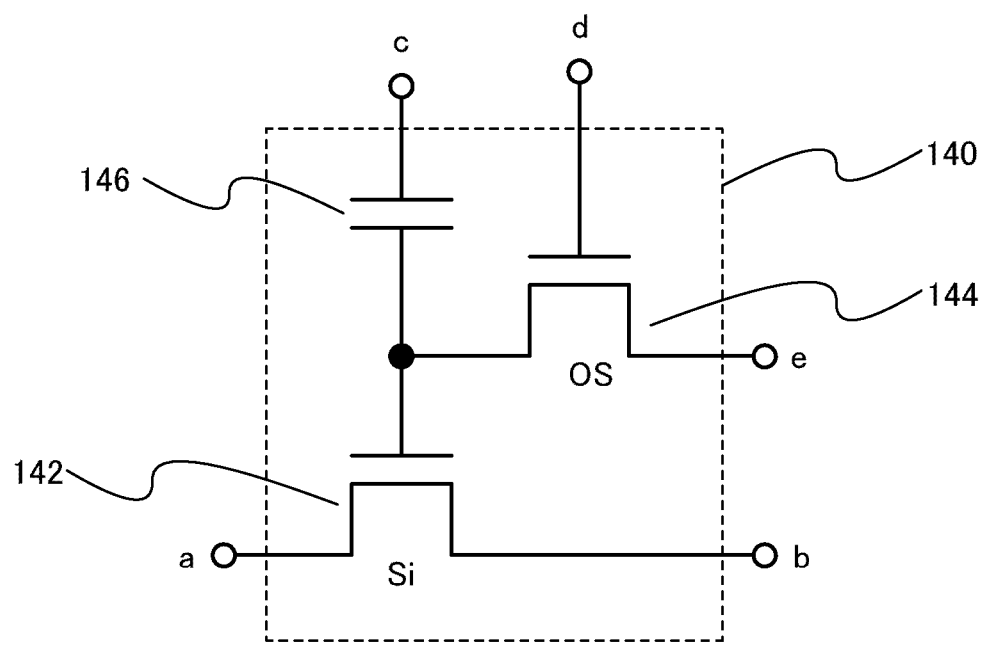
FIG. 4 is a circuit diagram illustrating an example of a basic cell in a memory circuit of a semiconductor memory device relating to one embodiment.

FIG. 4 illustrates an example of a basic cell of a memory which is formed by combination of a field-effect transistor formed using a silicon semiconductor and a field-effect transistor formed using a compound semiconductor with a wider band gap than a silicon semiconductor. In the following description, the field-effect transistor formed using a compound semiconductor with a wider band gap than a silicon semiconductor is a second transistor 144 and the field-effect transistor formed using a silicon semiconductor is a first transistor 142.

In a basic memory cell 140 illustrated in FIG. 4, a drain electrode of the second transistor 144 and a gate electrode of the first transistor 142 are electrically connected to each other. In addition, the drain electrode of the second transistor 144 and the gate electrode of the first transistor 142 are electrically connected to one of electrodes of a capacitor 146.

When the second transistor 144 includes a semiconductor whose band gap is 2.5 eV or more, preferably 3 eV or more, for example an oxide semiconductor such as metal oxide, the off-state current of the second transistor can be extremely low. Accordingly, the second transistor 144 is turned off, so that electric charge held in the capacitor 146 is prevented from leaking. Therefore, the potential of the gate electrode of the first transistor 142 can be held for a long time.

The advantage that the gate potential of the first transistor 142 can be held for a long time as described above is utilized, so that a circuit illustrated in FIG. 4 can operate as a non-volatile memory.

In the case where data is written, the gate of the second transistor 144 is turned on and the capacitor 146 is charged until the capacitor 146 has a predetermined potential. After that, the potential of the capacitor 146 is very little changed even after the second transistor 144 is turned off as long as the off-state current of the second transistor 144 is low. Although the capacitor 146 is connected to the gate electrode of the first transistor 142, the leakage current of this portion is almost negligible because the gate electrode is isolated from a semiconductor. Thus, the memory circuit in FIG. 4 is in a state where data is written and the state can be held for a long time unless the second transistor 144 is turned on.

In the case where data is read, a reading voltage is applied to a terminal c to judge whether electrical continuity of the first transistor 142 is established or not. The reading voltage is a voltage which is intermediate between an apparent threshold voltage of the first transistor 142 when the capacitor 146 is charged with predetermined voltage and the threshold voltage of the first transistor 142 when the capacitor 146 is not charged (data is not written).

For example, in general, when the transistor 142 is an n-channel transistor, an apparent threshold voltage $V_{th\_H}$ in the case where an H-level potential is given to the gate electrode of the transistor 142 is lower than an apparent threshold voltage $V_{th\_L}$ in the case where an L-level potential is given to the gate electrode of the transistor 142. Accordingly, the reading voltage is made to be a potential $V_0$ which is intermediate between $V_{th\_H}$ and $V_{th\_L}$, so that whether the first transistor 142 is on or off (whether there is electrical continuity between a terminal a and a terminal b or not) can be judged; therefore, data stored in the memory circuit can be read.

Data is rewritten in a manner similar to data writing operation described above. More specifically, the second transistor 144 is turned on and a predetermined potential is supplied from a terminal e to the capacitor 146. After that, the second transistor 144 is turned off, so that in a manner similar to the above, the predetermined writing voltage is held in the capacitor 146.

For a non-volatile memory with a floating gate structure, data erasing operation is needed in which electric charge with which a floating gate is charged is extracted by application of a high voltage of a dozen volts to a transistor. However, for the memory circuit in FIG. 4, such data erasing operation is not necessary. In other words, data can be easily rewritten without data erasing operation in which electric charge charged in the capacitor 146 is extracted. The memory circuit in FIG. 4 with such characteristics can write, read, and rewrite data at high speed with a low voltage of 5 volts or lower, preferably 3 volts or lower when data of two stages (one bit) is written.

Note that a structure where the gate electrode of the first transistor 142, one electrode of the capacitor 146, and the drain electrode of the second transistor 144 are electrically connected can also be regarded as a floating gate structure because the region is electrically isolated when the second transistor 144 is off.

Such a structure that can be substantially regarded as a floating gate structure can be realized when the second transistor 144 includes an oxide semiconductor having a wide band gap of 2.5 eV or more, preferably 3 eV or more, so that the off-state current of the second transistor 144 is lower than or equal to one hundred thousandth of the off current of a transistor including a silicon semiconductor. Specifically, in the following manner, a transistor including an oxide semiconductor can have an off-state current per a channel width of 1 μm of 100 zA/μm or lower ($1\times10^{-19}$ A/μm), for example 10 zA ($1\times10^{-20}$ A), at room temperature. For example, when the off-state current of the second transistor 144 is 10 zA or less and the capacitance of the capacitor 146 is 10 fF, data can be stored for $10^4$ seconds or longer. Such extremely low off-state current cannot be realized with a normal silicon semiconductor.

Further, the memory circuit in FIG. 4 is very good also in reliability. In a non-volatile memory having a floating gate structure, electric charge is injected to a floating gate with application of high voltage, so that a tunnel insulating film deteriorates and the deterioration leads to limitation on the number of times of rewriting data. On the other hand, with the structure that can be substantially regarded as a floating gate structure, such deterioration does not occur in principle because electric charge can be easily charged and discharged by on and off of the second transistor 144 realizing extremely low off-state current.

In contrast, the first transistor 142 is preferably a transistor which operates at high speed in order to make reading speed high. For example, a transistor with a switching rate of 1 nanosecond or lower is preferably used as the reading transistor.

Because the basic cell of a memory illustrated in FIG. 4 includes two transistors and one capacitor, the area per unit memory cell can be smaller; for example, the area can be sufficiently smaller than that is the case of a static RAM which needs six transistors for one memory cell.

<Specific Structures of Memory Cell Array>

Figure 5:
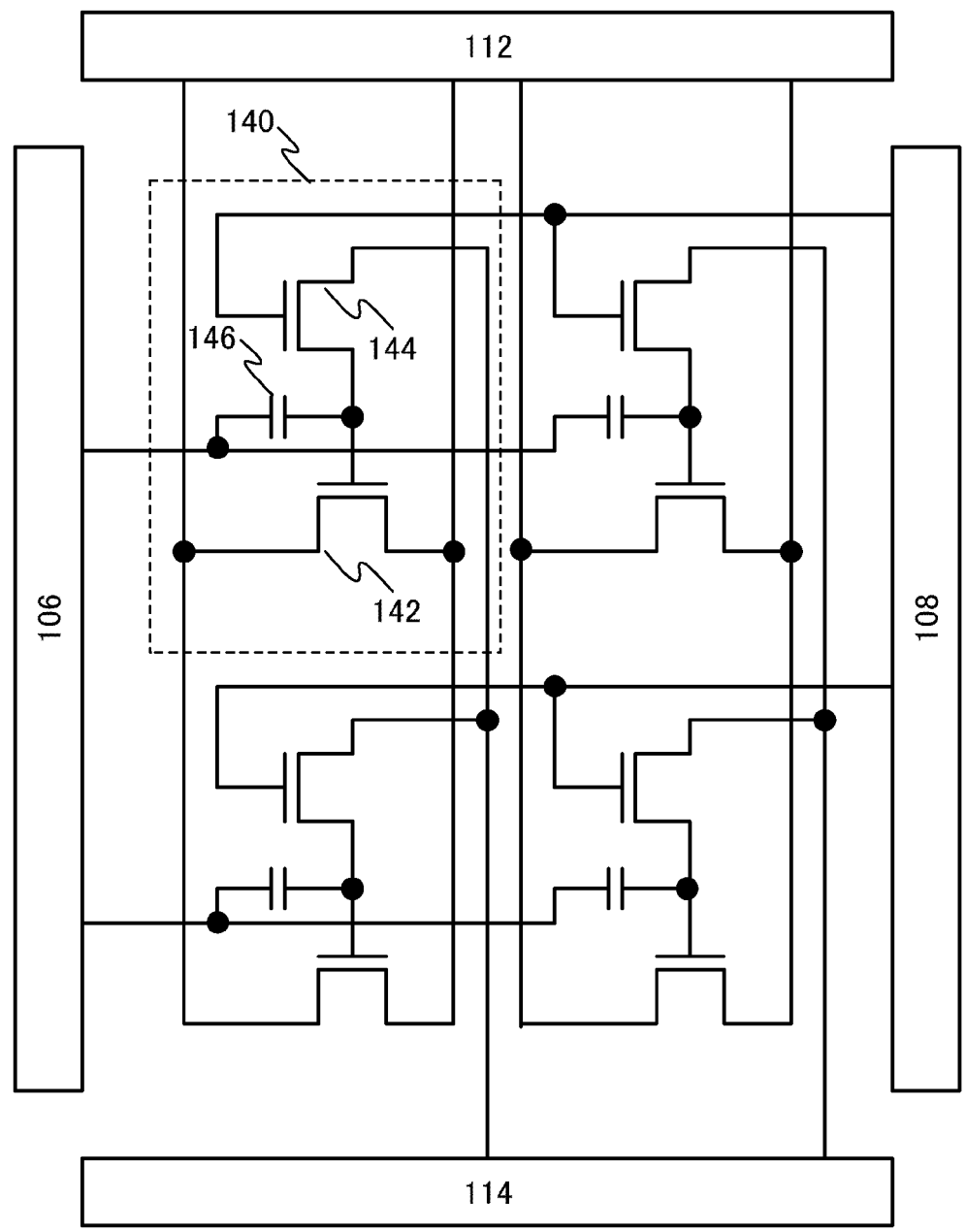
FIG. 5 illustrates an example in which a NOR-type memory circuit is formed using the basic cell illustrated in FIG. 4.

FIG. 5 illustrates an example of a memory circuit using the basic cell of a memory circuit illustrated in FIG. 4 as a memory cell. FIG. 5 is an example of a NOR-type memory including the basic cell 140. FIG. 5 illustrates a memory cell array including 2×2 memory cells but the number of memory cells is not limited thereto. The memory cells are controlled by the X direction writing decoder 108, the X direction reading decoder 106, the Y direction writing circuit 114, and the Y direction reading circuit 112.

The basic cell 140 includes the second transistor 144, the first transistor 142, and the capacitor 146. The drain electrode of the second transistor 144 and the gate electrode of the first transistor 142 are electrically connected to each other and one of electrodes of the capacitor 146 is electrically connected to the drain electrode and the gate electrode.

The basic cell 140 is determined to be in a data written state or a data unwritten state by whether the capacitor is charged with electric charge of the threshold voltage of the first transistor 142 or not. When data is written, the second transistor 144 is turned on by the X direction writing decoder 108 and a writing signal is supplied from the Y direction writing circuit 114, so that the capacitor 146 is charged. When data is read, a reading voltage (gate voltage) is supplied from the X direction reading decoder 106 to the first transistor 142 so that whether the first transistor 142 is turned on or not is judged by the Y direction reading circuit 112.

If the electric charge with which the capacitor is charged immediately disappears due to the leakage current of the second transistor 144, refresh operation is needed as in the case of a dynamic RAM. However, in the case where the off-state leakage current of the second transistor 144 is extremely low, the memory in FIG. 5 can substantially function as a non-volatile memory. In other words, a NOR-type memory cell array includes the basic cell 140, so that a non-volatile NOR-type memory can be realized without providing a floating gate in a transistor on purpose.

Figure 6:
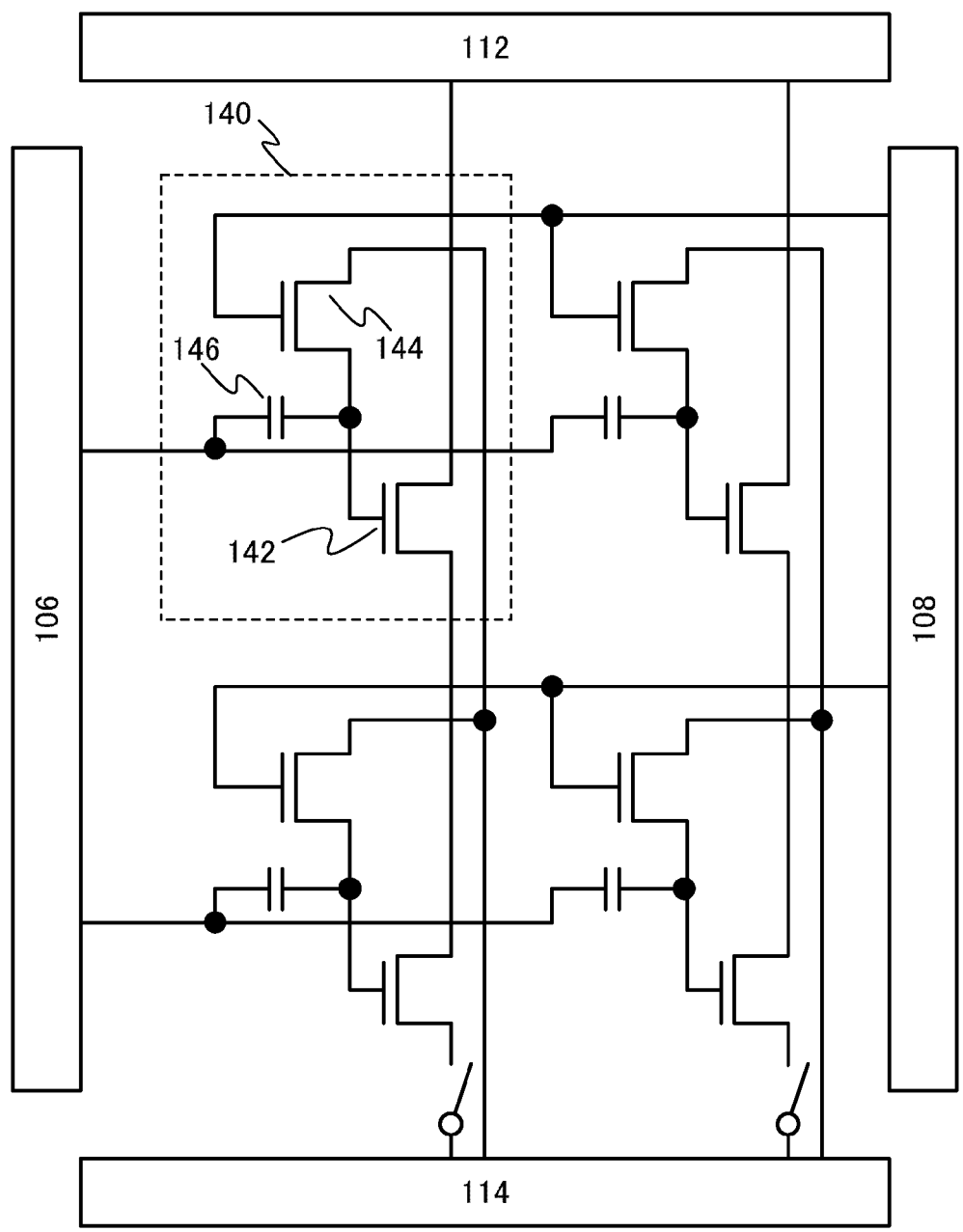
FIG. 6 illustrates an example in which a NAND-type memory circuit is formed using the basic cell illustrated in FIG. 4.

FIG. 6 illustrates the case where a NAND-type memory circuit includes the basic cell 140. Operations of writing and reading data are similar to those of the memory circuit in FIG. 5. In the case of a NAND-type memory circuit, data is written and read every column, which is different from a NOR-type memory circuit. Also in this case, the off-state current of the second transistor 144 is low.

Figure 7:
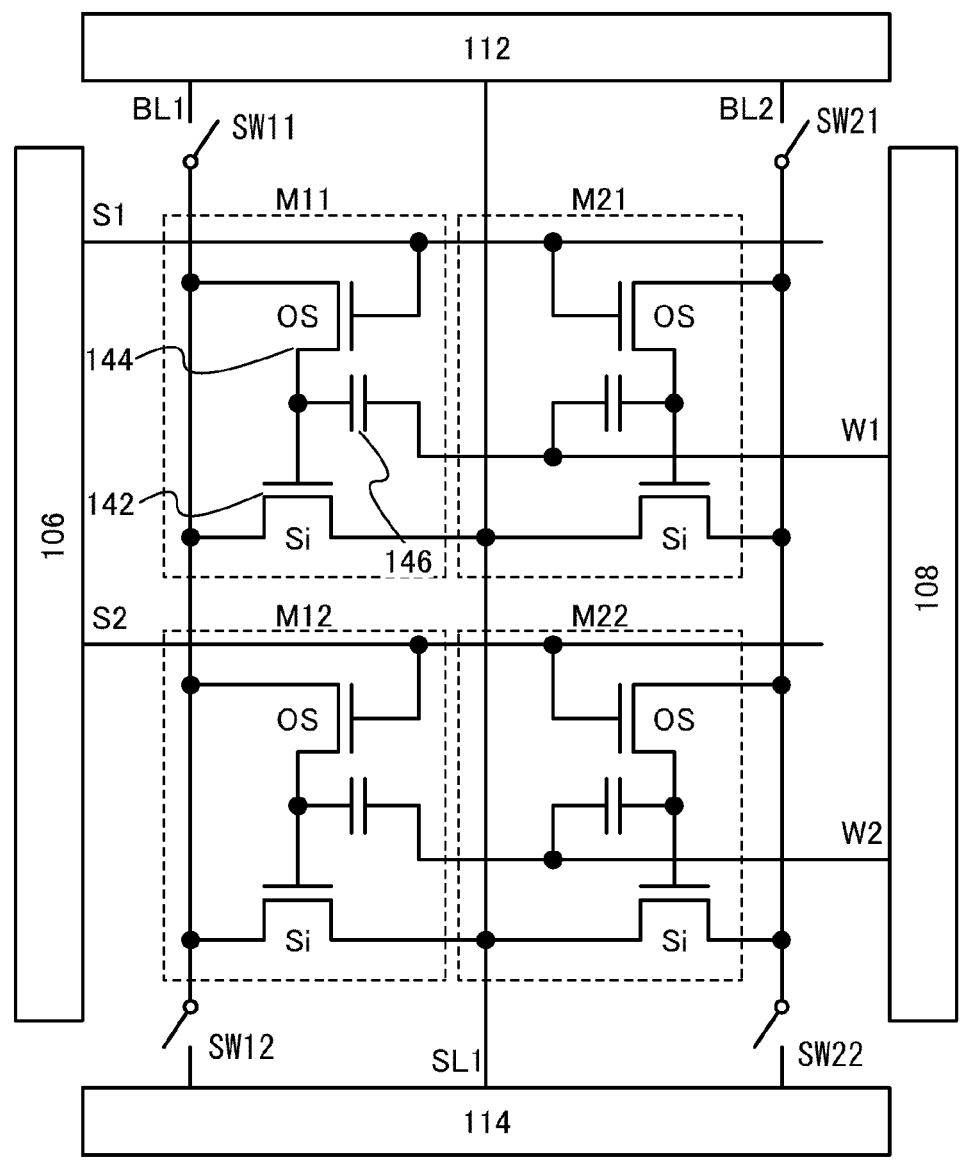
FIG. 7 illustrates an example in which a memory circuit is formed using the basic cell illustrated in FIG. 4.

FIG. 7 illustrates an example of the memory circuit in which the basic cells of the memory illustrated in FIG. 4 are arranged in matrix. FIG. 7 illustrates the case of a memory cell array of 2×2 bits. In the memory circuit illustrated in FIG. 7, word lines W1 and W2 connected to the capacitor 146, signal lines S1 and S2 connected to the gate electrode of the second transistor 144, bit lines BL1 and BL2 connected to the second transistor 144 and the first transistor 142, and a source line SL1 connected to a source electrode of the first transistor 142 form a matrix. The source electrodes of the first transistors 142 of the memory cells adjacent to each other are connected to the source line SL1, so that the number of wirings is reduced.

The word lines W1 and W2 are controlled by the X direction writing decoder 108, the signal lines S1 and S2 are controlled by the X direction reading decoder 106, and the bit lines BL1 and BL2 are controlled by the Y direction reading circuit 112 and the Y direction writing circuit 114. The Y direction reading circuit 112 and the Y direction writing circuit 114 do not transmit or receive a signal to/from the bit lines BL1 and BL2 at the same time. The connection between the Y direction reading circuit 112 and the Y direction writing circuit 114 are controlled by switches SW11, SW12, SW21, and SW22.

The operations of writing and reading data of the memory circuit are approximately as follows. For example, when "1" is written to a memory cell M11 and "0" is written to a memory cell M21, a select signal V1 is supplied to the signal line 51 so that the second transistors 144 of the memory cells M11 and M21 are turned on. Concurrently, a potential of 0 V is supplied to the signal line S2 so that the second transistors 144 of memory cells M12 and M22 are turned off. Then, the switch SW12 is turned on so that voltage V2 to write "1" is supplied to the bit line BL1 (V2 is a voltage higher than the threshold voltage of the first transistor 142). In addition, the switch SW22 is turned on so that voltage 0 V to write "0" is supplied to the bit line BL2. As a result, the capacitor 146 of the memory cell M11 is charged to have V2 and the capacitor 146 of the memory cell M21 has 0 V.

After that, the potential of the signal line 51 is made to be 0 V, and the data writing operation is finished. At that time, the switches SW12 and SW22 are turned off and the potential of the signal line 51 is made to be 0 V before the potentials of the bit lines BL1 and BL2 are changed so that the potentials of the capacitors 146 are not changed.

After data is written, the threshold voltage of the memory cell is Vw0 when data "0" has been input or Vw1 when data "1" has been input. Here, the threshold voltage of the memory cell means a voltage input to a terminal connected to the word lines WL1 and WL2 in order to change resistance between the source electrode and the drain electrode of the first transistor 142. Note that Vw0>0>Vw1 is satisfied.

For reading data, a potential of 0 V is supplied to the word line W1 and the potential VL is supplied to the word line W2. The potential VL is lower than the threshold voltage Vw1. When a potential of 0 V is supplied to the word line W1, the first transistor 142 of the memory cell M21 to which "0" is written is turned off and the first transistor 142 of the memory cell M11 to which "1" is written is turned on. When the potential VL is supplied to the word line W2, the first transistors 142 of the memory cells M12 and M22 are turned off, so that data is not read.

Then, the switches SW11 and SW21 are turned on so that the Y direction reading circuit 112 and the bit lines BL1 and BL2 are brought into conduction. The potential of the source line SL1 is 0 V. As a result, the memory cell M11 is in a low resistance state because the first transistor 142 is on, and the memory cell M21 is in a high resistance state because the first transistor 142 is off. The Y direction reading circuit 112 connected to the bit lines BL1 and BL2 can read data from difference in resistance state between the bit line and the source line.

In this case, when the off-state current of the second transistor 144 is extremely low, the potential of the capacitor 146 is very little changed and written data can be stored for a long time. This allows refresh operation needed for a dynamic RAM to be unnecessary or to be performed at extremely low frequency; therefore, power consumption needed for operation of the memory circuit can be smaller. In addition, the semiconductor memory device can hold stored data for a long time even after the power is turned off Further, because data writing is completed by charging the capacitor 146, operations of writing and rewriting data can be performed at higher speed. In addition, as for data reading operation, a transistor including a silicon semiconductor, which can operate at high speed, is used as the first transistor 142, so that data reading speed can be higher.

<Memory Structure of Memory Controller>

Then, a memory structure that can be applied to the memory controller 118 will be described. The memory cell array 138 storing the address of a defective memory cell is formed using a non-volatile memory because of the necessity to store data. As for the non-volatile memory, a memory including a transistor having a floating gate can be used. Specifically, a NOR-type non-volatile memory or a NAND-type non-volatile memory can be used. Because such a non-volatile memory can be realized with a MOSFET including a silicon semiconductor, the non-volatile memory can be formed in the circuit of the memory controller.

The memory circuits illustrated in FIG. 5 to FIG. 7 can be used as a memory of the memory controller 118. These memory circuits can substantially operate as non-volatile memories because electric charge can be accumulated in their capacitors applying voltage to the gate electrodes of the first transistors 142 by low off-state currents of the second transistors 144. These memory circuits do not need high voltage in writing and erasing data unlike a non-volatile memory including a floating gate transistor; therefore, power consumption can be smaller. Further, unlike a dynamic RAM, refresh operation need not be performed at short intervals in order to hold electric charge of the capacitor. As described above, non-volatile memory circuits illustrated in FIG. 5, FIG. 6, and FIG. 7 are preferably used in view of low voltage driving and low power consumption.

<Combination of Memory Cell Array and Memory of Memory Controller>

In a semiconductor memory device of this embodiment, one of features is that a memory for a redundant function is provided for the memory controller. Note that the combination of the memory cell array can be set as appropriate.

For example, the memory cell array 100 can be formed using a transistor including a silicon semiconductor and the memory cell array 138 of the memory controller 118 can also be formed using a transistor including a silicon semiconductor. In that case, they are formed using the existing production line.

Alternatively, the memory cell array 100 can be formed using a transistor including a silicon semiconductor and the memory cell array 138 of the memory controller 118 can be formed using a transistor including a semiconductor having wider band gap than a silicon semiconductor. With such a transistor, the memory controller 118 can operate at higher speed because data is not written and erased by a tunnel current. Further, the memory controller 118 does not need a step-up circuit, so that leading of a power supply line can be simplified.

Further alternatively, the memory cell array 100 can be formed using a transistor including a semiconductor with band gap wider than that of a silicon semiconductor, and similarly, the memory cell array 138 of the memory controller 118 can be formed using a transistor including a semiconductor with band gap wider than that of a silicon semiconductor. In this case, driving voltage of the semiconductor memory device can be unified. More specifically, the driving voltage of the logic circuit and the voltage needed for operation of the memory circuit are the same. Therefore, a step-up circuit can be omitted.

<Device Structure of OS—Si Hybrid>

Figure 8A:
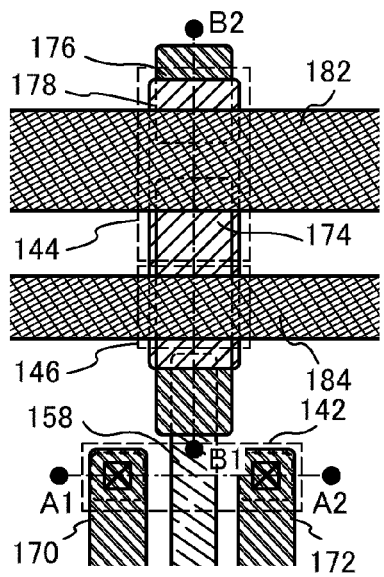
FIGS. 8A and 8B illustrate a structure example in which two transistors and a capacitor which form the basic cell illustrated in FIG. 4 are formed over a semiconductor substrate.
Figure 8B:
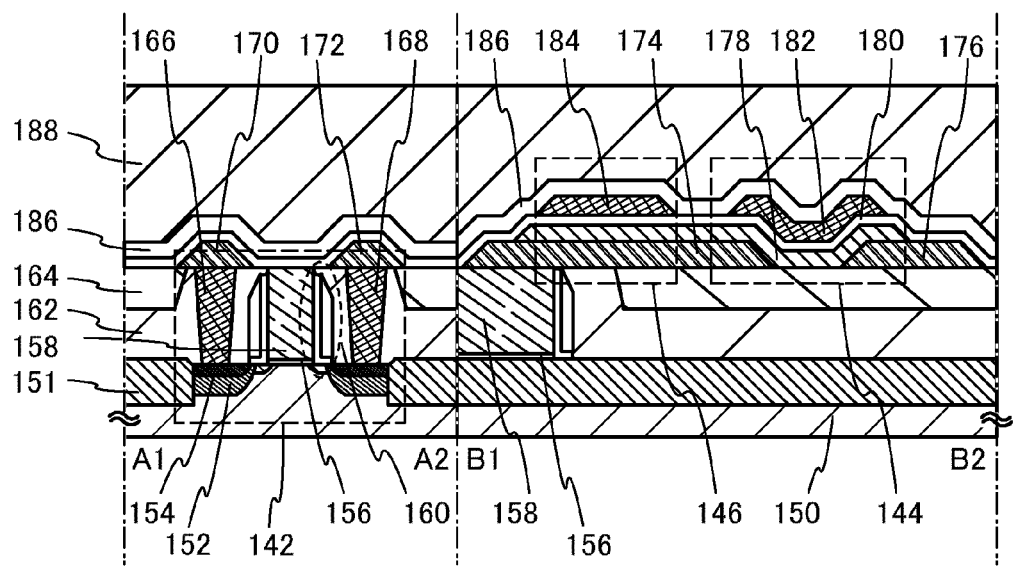

FIGS. 8A and 8B illustrate an example of a semiconductor memory device of an embodiment of the present invention formed by combining a transistor including a silicon semiconductor and a transistor including a semiconductor with band gap wider than that of a silicon semiconductor. In this example, an oxide semiconductor is used as a semiconductor material having wider band gap than a silicon semiconductor.

FIG. 8A is a plan view of part of a memory cell of a semiconductor memory device and FIG. 8B is a cross-sectional view taken along line A1-A2 and line B1-B2 in FIG. 8A. Description will be given with reference to both the drawings.

FIGS. 8A and 8B illustrate a structure in which the second transistor 144 including an oxide semiconductor, the first transistor 142 including a silicon semiconductor, and the capacitor 146 are electrically connected to one another. If the connection structure is illustrated by an equivalent circuit, it is the same as that of the basic cell in FIG. 4. Although all the transistors are n-channel transistors here, p-channel transistors can also be used instead of the n-channel transistors.

The first transistor 142 is an insulated-gate field-effect transistor formed over a semiconductor substrate 150. A gate electrode 158 of the first transistor 142 is provided to be isolated from the semiconductor substrate 150 by a gate insulating layer 156. A sidewall insulating layer 160 is provided on a side surface of the gate electrode 158. In the semiconductor substrate 150, impurity regions 152 forming a source region and a drain region are formed with the gate electrode 158 provided therebetween. Silicide layers 154 may be provided over surface portions of the impurity regions 152 in order to lower the resistance of the source region and the drain region. Further, an element-isolation insulating layer 151 is provided in contact with the impurity region 152.

An insulating layer 162 and an insulating layer 164 are provided over the semiconductor substrate 150. For example, the insulating layer 162 includes silicon nitride and the insulating layer 164 includes silicon oxide. The top surfaces of the insulating layers are planarized so as to expose the top portion of the gate electrode 158. Contact plugs 166 and 168 including a conductive material are provided so as to penetrate the insulating layer 162 or both the insulating layer 162 and the insulating layer 164 and to be in contact with the impurity regions 152 (or the silicide layers 154). Further, wirings 170 and 172 are formed so as to be in contact with the contact plugs 166 and 168, respectively, over the insulating layers 162 and 164. Note that the semiconductor substrate 150 may be single crystal silicon. Furthermore, the first transistor 142 may be formed using an SOI (silicon on insulator) substrate.

The second transistor 144 is provided over the planarized insulating layers. A drain electrode 174 of the second transistor 144 is provided in contact with the gate electrode 158 in a region where the gate electrode 158 of the first transistor 142 is extended toward the second transistor 144. In this manner, the gate electrode 158 and the drain electrode 174 are in direct contact with each other, whereby the structure is simplified and a step for providing the contact plug in an insulating layer is not needed.

An oxide semiconductor layer 178 is provided in contact with the drain electrode 174 and a source electrode 176. In the second transistor 144, the end portions of the drain electrode 174 and the source electrode 176 are preferably tapered in order to ensure the coverage with the oxide semiconductor layer 178. Here, a taper angle is, for example, greater than or equal to 30° and less than or equal to 60°. Note that the taper angle is a tilt angle formed by a side surface and a bottom surface of a layer having a tapered shape (e.g., the source electrode 176 or the drain electrode 174) in the case where the layer is observed from a direction perpendicular to a cross section (a plane perpendicular to the surface of a substrate).

Because the drain electrode 174 and the source electrode 176 are provided at a predetermined interval, the oxide semiconductor layer 178 is in contact with the insulating layer 164 between the drain electrode 174 and the source electrode 176. In this structure, the insulating layer 164 includes silicon oxide which is chemically stable; therefore, the interface between the oxide semiconductor layer 178 and the insulating layer 164 is stable because both the oxide semiconductor layer 178 and the insulating layer 164 include oxide.

The oxide semiconductor layer 178 is covered with a gate insulating layer 180. A gate electrode 182 is provided over the gate insulating layer 180 so as to overlap with the drain electrode 174 and the source electrode 176.

Note that the oxide semiconductor layer 178 is preferably an oxide semiconductor layer which is highly purified by sufficiently removing an impurity such as hydrogen therefrom or sufficiently supplying oxygen thereto. Specifically, the hydrogen concentration in the oxide semiconductor layer 178 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower, for example. Note that the hydrogen concentration in the oxide semiconductor layer 178 is measured by secondary ion mass spectrometry (SIMS). In the oxide semiconductor layer 178 which is highly purified by sufficiently reducing the hydrogen concentration therein and in which a defect level in an energy gap due to oxygen deficiency is reduced by supplying a sufficient amount of oxygen, the carrier density is lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per micrometer of channel width) at room temperature is 100 zA/μm or lower, preferably 10 zA/μm or lower. The second transistor 144 with excellent off-state current characteristics can be obtained with the use of such an oxide semiconductor that is highly purified to be i-type (intrinsic) or substantially i-type.

The capacitor 146 has a stacked structure of the drain electrode 174, the oxide semiconductor layer 178, the gate insulating layer 180, and an electrode 184. The structure of the capacitor 146 includes the stacked layer of the oxide semiconductor layer 178 and the gate insulating layer 180, which have high dielectric constant, as a dielectric; therefore, a decrease in capacitance caused by an increase in thickness of a dielectric layer and short-circuit of electrodes of the capacitor 146 can be prevented.

Further, a passivation layer 186 is provided over the second transistor 144 and the capacitor 146 and an interlayer insulating layer 188 is provided over the passivation layer 186.

With the structure in FIGS. 8A and 8B, integration density can be enhanced because the first transistor 142 and the second transistor 144 can be provided so as to be close to each other by direct contact between the gate electrode 158 and the drain electrode 174.

Next, an example of a manufacturing method of the semiconductor memory device will be described with reference to FIGS. 9A to 9D. Here, the first transistor 142 is acceptable as long as the transistor is an insulated-gate field-effect transistor formed over the semiconductor substrate 150 (e.g., a silicon wafer) such as the transistor illustrated in FIGS. 8A and 8B may be used. Variety of well-known structures can be used as minute structures of a gate electrode, a source electrode, and a drain electrode of the first transistor 142 as long as the transistor realizes switching operation.

Figure 9A:
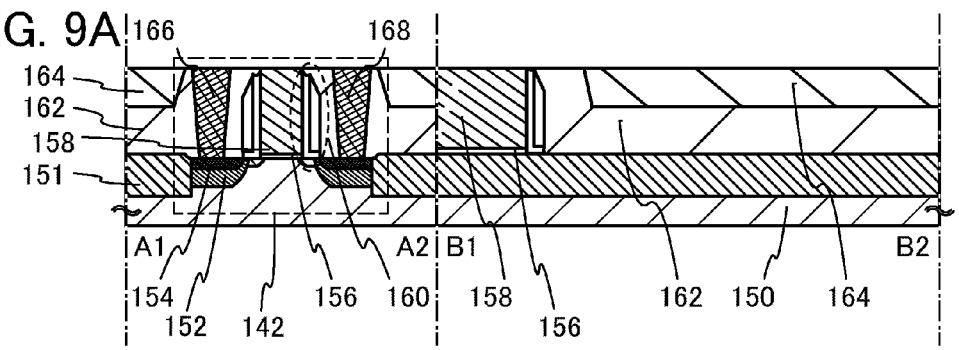
FIGS. 9A to 9D illustrate an example of a process for manufacturing the structure illustrated in FIGS. 8A and 8B.

As illustrated in FIG. 9A, the insulating layer 162 including silicon nitride and the insulating layer 164 including silicon oxide are provided over the semiconductor substrate 150 so that the first transistor 142 is embedded. Then, planarization is performed so as to expose the top portion of the gate electrode 158. The planarization can be performed by chemical mechanical polishing. Further, the contact plugs 166 and 168 are formed in openings which are formed in the insulating layer 162 and/or the insulating layer 164 and which reach to the impurity regions 152 (or the silicide layers 154).

Figure 9B:
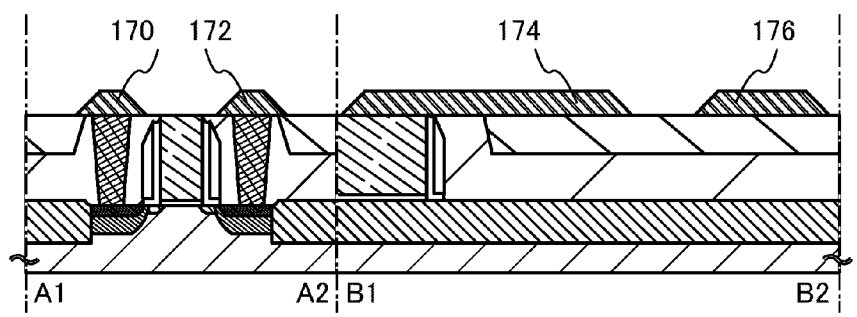

Then, as illustrated in FIG. 9B, the drain electrode 174 which is in contact with the gate electrode 158 and the source electrode 176 which is provided separately from the drain electrode 174 over the insulating layer 162 or both the insulating layer 162 and the insulating layer 164. The drain electrode 174 and the source electrode 176 are formed of metal such as titanium, molybdenum, tungsten, or tantalum, or nitride of the metal. The edge portions of the drain electrode 174 and the source electrode 176 are preferably tapered.

The wirings 170 and 172 that are in contact with the contact plugs 166 and 168 and that are formed from the same film as the drain electrode 174 and the source electrode 176 are formed.

Figure 9C:
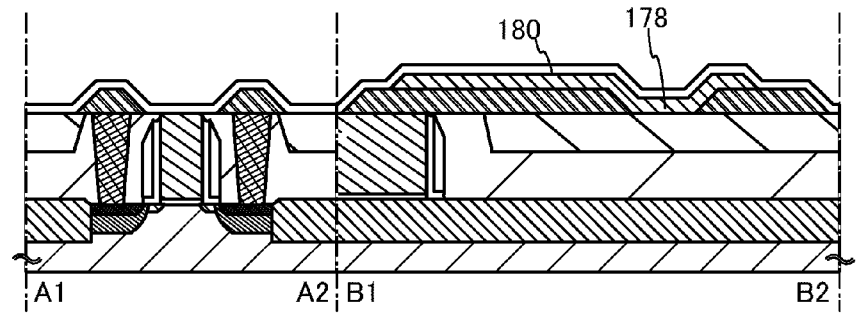

As illustrated in FIG. 9C, the oxide semiconductor layer 178 are formed in contact with the drain electrode 174 and the source electrode 176. The oxide semiconductor layer 178 is formed by sputtering, vapor deposition, or the like. In addition, the oxide semiconductor layer 178 may be formed by wet process such as a printing method or a coating method. The oxide semiconductor layer 178 is acceptable as long as it has such a size as is needed for formation of a second transistor and a capacitor, but the layer may be formed over the entire element formation surface of the semiconductor substrate 150.

Note that, as the oxide semiconductor material, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O- based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor; a Sn—O-based oxide semiconductor; or a Zn—O-based oxide semiconductor.

There is an oxide semiconductor material expressed by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. An oxide semiconductor expressed by $InGaO_3(ZnO)_m$ (m>0) is a typical example of the In—Ga—Zn—O-based oxide semiconductor material described above. Note that the above-described compositions are derived from the crystal structures that the oxide semiconductor material can have and are mere examples.

The oxide semiconductor layer 178 is preferably subject to heat treatment performed at 250° C. to 450° C. for dehydration and dehydrogenation. That is because it is reported that part of hydrogen included in an oxide semiconductor behaves as a donor, which is not preferable in consideration of the reliability of a transistor. In addition, it is not preferable in respect of the reliability of a transistor that OH groups, moisture, or the like remains in the layer.

The gate insulating layer 180 is formed over the oxide semiconductor layer 178. It is preferable that the gate insulating layer 180 be formed of silicon oxide. Alternatively, the gate insulating layer 180 may formed of hafnium oxide. Further alternatively, the gate insulating layer 180 may have a stacked structure of a hafnium oxide film or a silicon oxide film. In order that the oxide semiconductor layer 178 does not include hydrogen, the gate insulating layer 180 is preferably formed under an atmosphere including little hydrogen. As a deposition method which is performed under such an atmosphere, sputtering or vapor deposition can be employed.

After the gate insulating layer 180 is formed, second heat treatment is preferably performed in an inert gas atmosphere or an oxygen atmosphere. The second heat treatment can reduce variation in electric characteristics of the transistor. In addition, in the case where the gate insulating layer 180 contains oxygen, oxygen is supplied to the oxide semiconductor layer 178 and oxygen deficiency of the oxide semiconductor layer 178 is filled, whereby an i-type oxide semiconductor layer (an intrinsic semiconductor) or an oxide semiconductor layer which is extremely close to an i-type can be formed.

Figure 9D:
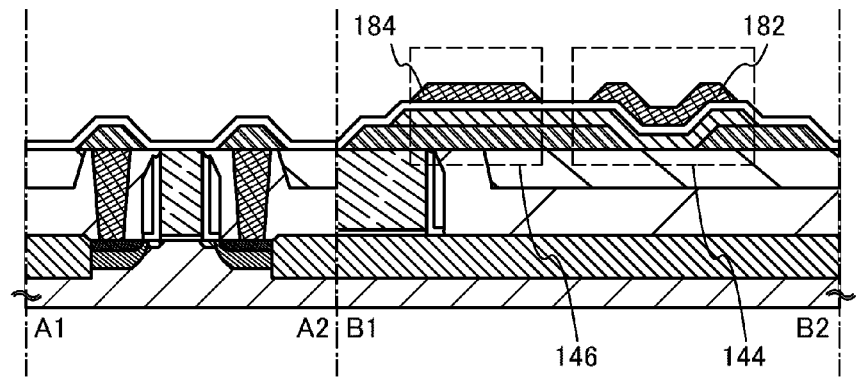

After that, as illustrated in FIG. 9D, over the gate insulating layer 180, the gate electrode 182 is formed to overlap with the oxide semiconductor layer 178, and the electrode 184 is formed to overlap with the drain electrode 174. Then, the gate electrode 182 and the electrode 184 can be formed in such a manner that a conductive layer is formed over the gate insulating layer 180 and then etched selectively.

Further, as described with reference to FIGS. 8A and 8B, the passivation layer 186 and the interlayer insulating layer 188 are formed. Note that the interlayer insulating layer 188 is preferably formed to have a flat surface. By forming the interlayer insulating layer 188 so as to have a planarized surface, an electrode, a wiring, or the like can be favorably formed over the interlayer insulating layer 188 even in the case where the semiconductor device is reduced in size, for example. The interlayer insulating layer 188 can become planarized by a method such as chemical mechanical polishing (CMP).

Through the steps, the semiconductor memory device illustrated in FIGS. 8A and 8B can be formed.

The hydrogen concentration in the oxide semiconductor layer 178 included in the second transistor 144 formed through the steps is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. The first oxide semiconductor layer 178 has a sufficiently low carrier density (e.g., less than $1 \times 10^{12}$/cm$^3$, more preferably less than $1.45 \times 10^{10}$/cm$^3$) as compared to a general silicon wafer having a carrier density of approximately $1 \times 10^{14}$/cm$^3$. Because of this, the off state current is sufficiently reduced. For example, the off-state current (here, current per micrometer of channel width) of the transistor 144 at room temperature is 100 zA/μm or lower, preferably 10 zA/mm or lower.

With the use of the purified and intrinsic oxide semiconductor layer 178, the off-state current of the second transistor 144 can be sufficiently reduced. Further, with the use of the transistor 144, the basic cell of a memory in FIG. 4 can retain stored data for an extremely long time.

<Explanation of Low Off-State Current of OSFET>

Figure 10:
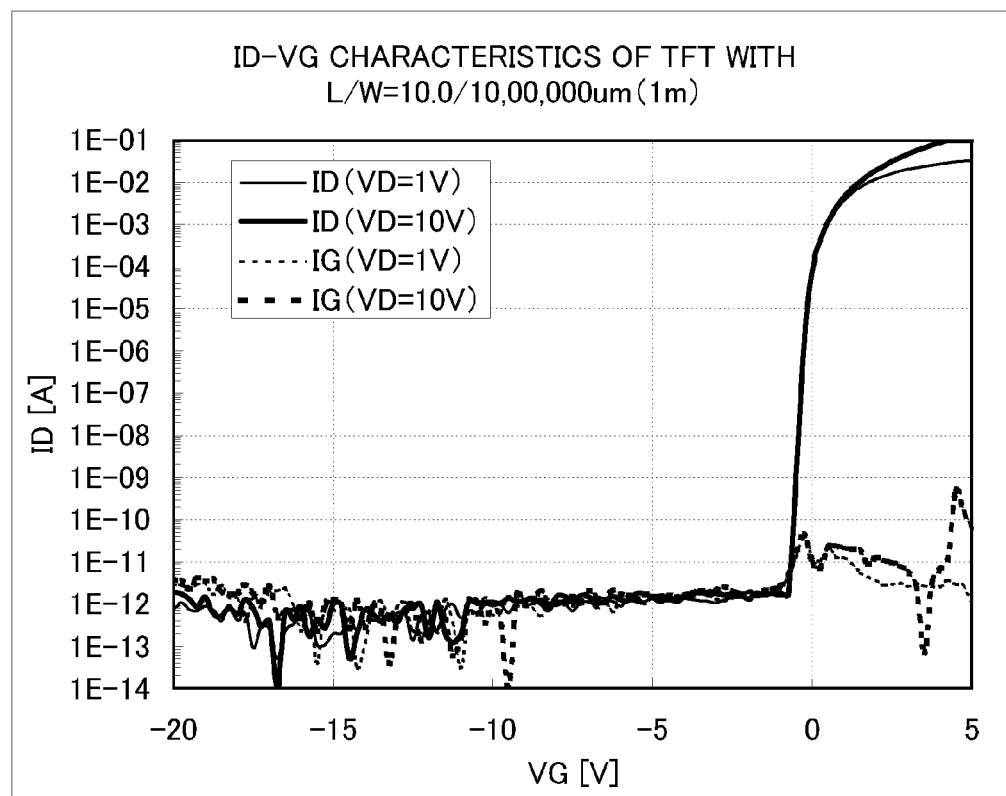
FIG. 10 shows gate voltage-drain current characteristics of a transistor formed using an oxide semiconductor.

FIG. 10 illustrates an example of a result of evaluating the off-state current of a transistor including a highly-purified oxide semiconductor.

FIG. 10 shows the gate voltage-drain current characteristics of the transistor. The channel width of the transistor used for the measurement is 1 m. In the case where the drain voltage VD is +1 V or +10 V and the gate voltage VG is within the range of −5 V to −20 V, the off-state current of the transistor was found to be lower than $1 \times 10^{-12}$ A. The off-state current density, which is the off-state current per micrometer of the channel width, of the transistor is lower than 1 aA/μm ($1 \times 10^{-18}$ A/μm).

The result indicates that the transistor with a channel width of smaller than 1 μm is capable of a further decrease in off-state current. Further, if the basic cell of a memory in FIG. 4 is formed with the transistor whose off-state current is low, electric charge with which the capacitor 146 is charged can be held for a long time; therefore, the basic cell can operate as a non-volatile memory cell.

<Application Example>

Figure 11A:
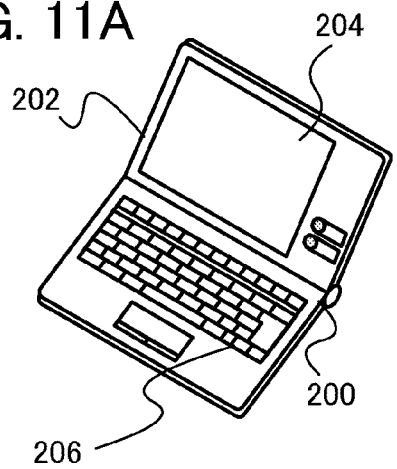
FIGS. 11A to 11C illustrate examples of an electronic device completed by one semiconductor memory device of an embodiment.

FIG. 11A illustrates an example of a computer including a semiconductor memory device. The computer includes a housing 200, a housing 202, a display portion 204, a keyboard 206, and the like. The computer includes a memory medium which is called a SSD (solid state drive) including a flash memory, and the SSD can be realized by the semiconductor memory device described in this embodiment.

As compared to a conventional SSD including a flash memory, the semiconductor memory device of this embodiment has advantages that the device can operate at low voltage, that data can be written and read at high speed, and that the device is more user-friendly like a hard disk drive because data can be overwritten to be stored. In addition, a memory for a redundant function is included, so that the frequency of occurrence of troubles caused in rewriting or writing data can be decreased.

Figure 11B:
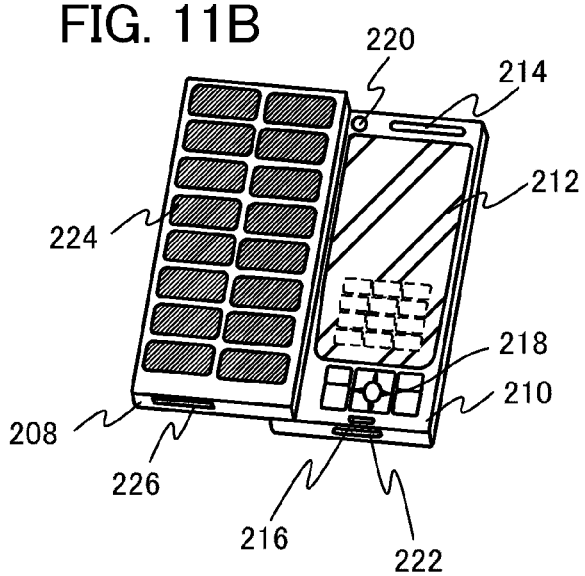

FIG. 11B illustrates an example of a mobile phone. The mobile phone has a structure in which a housing 208 and a housing 210 overlap with each other and can be slid in a horizontal direction. The housing 210 includes a display panel 212, a speaker 214, a microphone 216, a pointing device 218, a camera lens 220, an external connection terminal 222, and the like. The housing 208 is provided with a solar cell 224 for charging the mobile phone, an external memory slot 226, and the like. In addition, an antenna is incorporated in the housing 210. The mobile phone has a function of a telephone directory in which names, phone numbers, or the like of persons are recorded.

The semiconductor memory device in this embodiment is incorporated in the mobile phone, so that the function of a telephone directory can be realized. A similar function can be realized with a conventional flash memory, but with the semiconductor memory device of this embodiment, operation with low voltage and low power consumption can be realized. In addition, a memory for a redundant function is provided, so that the frequency of occurrence of troubles caused in rewriting or writing data can be decreased. Further, the semiconductor memory device in this embodiment can be used in the case of realizing a function of e-mailing or a function of taking photos.

Figure 11C:
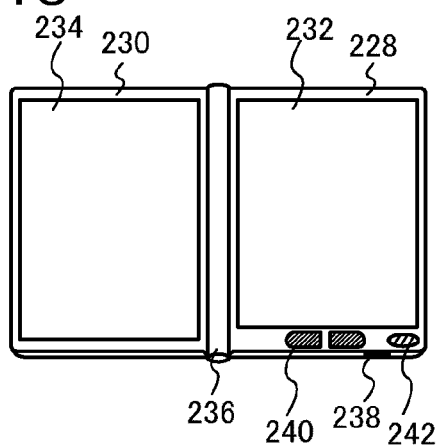

FIG. 11C illustrates an electronic book reader mounted with electronic paper. The electronic book reader has two housings of a housing 228 and a housing 230. The housing 228 and the housing 230 are provided with a display portion 232 and a display portion 234 which are formed of electronic paper, respectively. The housing 228 and the housing 230 are connected by a connection portion 236. In the case of providing the connection portion 236, the electronic book reader can be opened and closed like a paper book. The housing 228 is provided with a power switch 238, operation keys 240, a speaker 242, and the like.

At least one of the housing 228 and the housing 230 is provided with the semiconductor device described in this embodiments. Therefore, an electronic book reader in which data is written and read at high speed, data can be stored for a long time, and power consumption is sufficiently reduced can be realized.

This application is based on Japanese Patent Application serial no. 2010-010522 filed with the Japan Patent Office on Jan. 20, 2010, the entire contents of which are hereby incorporated by reference.

The invention claimed is:

1. A semiconductor memory device comprising:
a memory cell array comprising memory cells arranged in matrix, the memory cell array including a main memory region and a redundant memory region;
a driver circuit configured to drive the memory cell array; and
a memory controller configured to control operation of the driver circuit,
wherein the memory controller comprises:
a memory portion configured to store address data of a defective memory cell in the main memory region;
a redundant address storage portion configured to store address data of the redundant memory region; and
a selector configured to select the address data of the redundant memory region stored in the redundant address storage portion instead of the address data of the defective memory cell stored in the memory portion.

2. The semiconductor memory device according to claim 1, wherein the driver circuit includes at least two circuits.

3. The semiconductor memory device according to claim 1, wherein a row in the redundant memory region is capable of being read out instead of a row having the defective memory cell.

4. The semiconductor memory device according to claim 1, wherein a column in the redundant memory region is capable of being read out instead of a column having the defective memory cell.

5. A semiconductor memory device comprising:
a memory cell array comprising memory cells arranged in matrix, the memory cell array including a main memory region and a redundant memory region;
a driver circuit configured to drive the memory cell array; and
a memory controller configured to control operation of the driver circuit,
wherein the memory controller comprises:
a memory portion configured to store address data of a defective memory cell in the main memory region; and
a redundant address storage portion configured to store address data of the redundant memory region,
wherein the memory portion comprises a memory cell, and the memory cell comprises a first transistor, a second transistor and a capacitor, and
wherein a gate electrode of the first transistor, a drain electrode of the second transistor and an electrode of the capacitor are electrically connected to one another.

6. The semiconductor memory device according to claim 5, wherein the driver circuit includes at least two circuits.

7. The semiconductor memory device according to claim 5, wherein a row in the redundant memory region is capable of being read out instead of a row having the defective memory cell.

8. The semiconductor memory device according to claim 5, wherein a column in the redundant memory region is capable of being read out instead of a column having the defective memory cell.

9. The semiconductor memory device according to claim 5, wherein a channel region of the second transistor is formed in an oxide semiconductor layer.

10. The semiconductor memory device according to claim 5, wherein an off-state current per micrometer of a channel width of the second transistor is 100 aA/μm or lower.

11. The semiconductor memory device according to claim 5, wherein a transistor, which is other than the second transistor included in the driver circuit, the memory cell array, and the memory controller includes a silicon semiconductor.

12. A semiconductor memory device comprising:
a memory cell array comprising memory cells arranged in matrix, the memory cell array including a main memory region and a redundant memory region;
a driver circuit configured to drive the memory cell array; and
a memory controller configured to control operation of the driver circuit,
wherein each of the memory cells comprises a first transistor, a second transistor and a first capacitor,
wherein a gate electrode of the first transistor, a drain electrode of the second transistor and an electrode of the first capacitor are electrically connected to one another,
wherein the memory controller comprises:
a memory portion configured to store address data of a defective memory cell in the main memory region; and
a redundant address storage portion configured to store address data of the redundant memory region,
wherein the memory portion comprises a memory cell, and the memory cell comprises a third transistor, a fourth transistor and a second capacitor, and
wherein a gate electrode of the third transistor, a drain electrode of the fourth transistor and an electrode of the second capacitor are electrically connected to one another.

13. The semiconductor memory device according to claim 12, wherein the driver circuit includes at least two circuits.

14. The semiconductor memory device according to claim 12, wherein a row in the redundant memory region is capable of being read out instead of a row having the defective memory cell.

15. The semiconductor memory device according to claim 12, wherein a column in the redundant memory region is capable of being read out instead of a column having the defective memory cell.

16. The semiconductor memory device according to claim 12, wherein each channel region of the second transistor and the fourth transistor is formed in an oxide semiconductor layer.

17. The semiconductor memory device according to claim 12, wherein an off-state current per micrometer of a channel width of each of the second transistor and the fourth transistor is 100 aA/µm or lower.

18. The semiconductor memory device according to claim 12, wherein a transistor, which is other than the second transistor and the fourth transistor included in the driver circuit, the memory cell array, and the memory controller includes a silicon semiconductor.

\* \* \* \* \*

UNITED STATES PATENT AND TRADEMARK OFFICE
CERTIFICATE OF CORRECTION

PATENT NO.        : 8,514,642 B2                                   Page 1 of 1
APPLICATION NO.   : 13/005561
DATED             : August 20, 2013
INVENTOR(S)       : Jun Koyama It is certified that error appears in the above-identified patent and that said Letters Patent is hereby corrected as shown below:

In the Specification

At column 5, line 18, "TOW" should be -- row --;

At column 10, line 38, "51" should be -- S1 --;

At column 10, line 49, "51" should be -- S1 --;

At column 10, line 52, "51" should be -- S1 --;

At column 15, line 8, "$InMo_3(ZnO),$" should be -- $InMo_3(ZnO)_m$ --.

Signed and Sealed this
Nineteenth Day of November, 2013

Teresa Stanek Rea
*Deputy Director of the United States Patent and Trademark Office*

UNITED STATES PATENT AND TRADEMARK OFFICE
CERTIFICATE OF CORRECTION

PATENT NO.         : 8,514,642 B2                                       Page 1 of 1
APPLICATION NO.    : 13/005561
DATED              : August 20, 2013
INVENTOR(S)        : Jun Koyama It is certified that error appears in the above-identified patent and that said Letters Patent is hereby corrected as shown below:

In the Specification

At column 5, line 18, "TOW" should be -- row --;

At column 10, line 38, "51" should be -- S1 --;

At column 10, line 49, "51" should be -- S1 --;

At column 10, line 52, "51" should be -- S1 --;

At column 15, line 8, "$InMO_3(ZnO)$," should be -- $InMO_3(ZnO)_m$ --.

This certificate supersedes the Certificate of Correction issued November 19, 2013.

Signed and Sealed this
Seventeenth Day of June, 2014

Michelle K. Lee
*Deputy Director of the United States Patent and Trademark Office*